United States Patent [19]

Mollier et al.

[11] Patent Number: 5,089,725

[45] Date of Patent: Feb. 18, 1992

[54] SELF-REFERENCED CURRENT SWITCH LOGIC CIRCUIT WITH A PUSH-PULL OUTPUT BUFFER

[75] Inventors: Pierre Mollier, Boissise le Roi; Jean-Paul Nuez, Savigny sur Orge; Pascal Tannhof, Cely en Biere, all of France

[73] Assignee: IBM Corporation, Armonk, N.Y.

[21] Appl. No.: 604,842

[22] Filed: Oct. 26, 1990

[30] Foreign Application Priority Data

Oct. 26, 1989 [EP] European Pat. Off. ........ 89480169.5

[51] Int. Cl.⁵ .................... H03K 19/086; H03K 3/01; H03K 17/16
[52] U.S. Cl. ................. 307/455; 307/296.1; 307/443
[58] Field of Search ...... 307/454, 455, 296.1, 307/443

[56] References Cited

U.S. PATENT DOCUMENTS

| | | | |
|---|---|---|---|
| 4,490,630 | 12/1984 | Freeman | 307/455 |
| 4,531,067 | 7/1985 | Banker et al. | 307/454 |
| 4,677,312 | 6/1987 | Freeman | 307/455 |
| 4,871,929 | 10/1989 | Hollstein et al. | 307/455 |
| 4,883,990 | 11/1989 | Umeki | 307/455 |

Primary Examiner—David Hudspeth
Assistant Examiner—Andrew Sanders

[57] ABSTRACT

The base circuit comprises a self-referenced preamplifier (31) of the differential type connected between first and second supply voltages and a push-pull output buffer stage connected between second and third supply voltages. The push-pull output buffer stage comprises a pull-up transistor and a pull-down transistor connected in series with the circuit output node coupled therebetween. These transistors are driven by complementary and substantially simultaneous signals S and S̄ supplied by the preamplifier. Both branches of the preamplifier are tied at a first output node (M). The first branch comprises a logic block performing the desired logic function of the base circuit that is connected through a load rsistor to the second supply voltage. The logic block consists of three parallel-connected input NPN transistors, whose emitters are coupled together at the first output node for NOR operation. The second branch is comprised of a biasing/coupling block connected to the second supply voltage and coupled to the first output node and to the base (B) node of the pull-down transistor. This block ensures both the appropriate polarization of the nodes in DC without the need of external reference voltage generators and a low impedance path for fast signal transmission of the output signal from node M to node B in AC, when input transistors of the logic block are ON. and base nodes. An anti-saturation block (AB), consisting typically of a Schottky Barrier Diode (SBD), is useful to prevent saturation of the pull down transistor (TDN) to further speed up the circuit.

21 Claims, 5 Drawing Sheets

SELF-REFERENCED CURRENT SWITCH LOGIC CIRCUIT WITH A PUSH-PULL OUTPUT BUFFER

The present invention relates in general to fast bipolar logic circuits of the ECL type, and more particularly to a family of single-ended current switch logic circuits in which the reference voltages have been eliminated. The new circuits feature a self-referenced preamplifier supplying complementary output signals that drive a push pull output buffer. The new circuits exhibit superior output driving capability, balanced delays and very low power consumption at fast switching speeds.

The ECL logic circuit family is characterized by a systematic usage of non saturated transistors, resulting in high speed switching. Given their performance, the ECL logic circuits are the ideal candidates for being implemented in high end computers, because they have a potentially better power-delay product compared to other logic circuits. Within the ECL logic circuit family, the single-ended current switch (SECS) circuit family is extensively used. It is based on the use of accurate reference voltages and of only true logic input signals. On the contrary, in the differential current switch (DCS) circuit family, no reference voltage is necessary, but both true and complement logic input signals are employed on the inputs. In both cases, the output buffer stage typically consists of an emitter-follower transistor structure.

FIG. 1 shows the implementation of a standard single-ended three-input NOR gate circuit in the current switch emitter-follower (CSEF) circuit technology. The circuit referenced, 10, essentially consists of a differential amplifier 11 and of an output buffer stage 12. Basically, differential amplifier 11 forms a tree comprised of two branches coupled between a first output node M and a supply node P. Output node M is fed by a first current source I1 tied to a first supply voltage VEE1. Supply node P is tied to a second supply voltage VC. The first branch comprises reference NPN transistor T0, the base of which is connected to a reference voltage VRef1, and resistor R0 connected in series. The other branch comprises parallel connected input NPN transistors T1, T2 and T3 and resistor R1 connected in series with a second output node N coupled therebetween. Node N is at the same potential as the collectors of input transistors T1, T2 and T3 which are tied together. On the other hand, emitters of transistors T0, T1, T2, and T3 are tied together to form said first output node M that is connected to said first current source I1. Amplifier 11 further includes circuit input terminals referenced 13, 13' and 13" to be used as the circuit inputs, where the logic input signals E1, E2 and E3 are respectively applied. Paralleled input NPN transistors T1, T2 and T3 form a logic block LB which determines the logic function performed by amplifier 11.

The output buffer stage 12 comprises active NPN transistor TUP connected in an emitter-follower configuration, loaded by a second current source I2 tied to a third supply voltage VEE2 with the circuit output node OUT1 coupled therebetween. Circuit output node OUT1 is connected to the circuit output terminal 14 where the circuit output signal VOUT1 is available. Collector of transistor TUP is connected to a fourth supply voltage VC1. The input of said emitter-follower output buffer stage is the base of active NPN transistor TUP, which is connected to the second output node N.

In circuit 10, the first current source I1 is formed by transistor TA in series with resistor RA. One end of this resistor is connected to said first supply voltage VEE1. The base of transistor TA is connected to a second reference voltage VRef2. Similarly, the second current source I2 is formed by transistor TB in series with resistor RB. One end of resistor RB is connected to said third supply voltage VEE2. The base of transistor TB is connected to a third reference voltage VRef3. In some applications, these transistor/resistor combinations are replaced by a single resistor, respectively referenced R and R' as shown in FIG. 1. Depending on the application, reference voltages VRef2 and Vref3 can have the same value and therefore be supplied by the same reference voltage generator. Also second and fourth supply voltages may have the same value VC. For optimal operation two power supplies are preferred, one of the supply voltages: VC, VEE1 or VEE2, being the potential of the ground GND; but, in some instances, the number of power supplies may be limited to one (VC, GND).

For sake of simplicity let us assume that logic block LB only consists of input transistor T1. When a logic input signal E1 is applied to the base of transistor T1 in differential amplifier 11, the voltage of input signal E1 is compared to the fixed reference voltage VRef1 applied to the base of transistor T0, so that either transistor T0 or T1 (but never both) can turn ON in a current mode, depending on whether voltage E1 is higher or lower than VRef1. The operation of the three-input NOR circuit 10 including three input transistors, can be easily derived therefrom. Differential amplifier 11 provides the OUT OF PHASE output signal $\bar{S}$ at second output node N, that drives the base of transistor TUP. The emitter-follower output buffer stage 12 operates without inverting this signal, so that circuit output signal VOUT1 of circuit 10, available at circuit output terminal 14, has the same polarity as signal $\bar{S}$. The circuit output signal VOUT1 is representative of the logic function F which is performed by circuit 10, so that in terms of logic signals, $VOUT1 = \bar{S} = \overline{E1} + \overline{E2} + \overline{E3}$. Note that, the IN PHASE output signal S, which is available on the collector of transistor T0 at node Q, with the same polarity as the potential of node M. Although, the circuit of FIG. 1 has been shown implemented with NPN transistors, in a standard way, it could be designed in various other fashions as well, still combining a differential amplifier structure supplying an OUT OF PHASE output logic signal $\bar{S}$ and an emitter-follower output buffer stage driven by the said signal $\bar{S}$.

It is also important to notice that the output active pull-up device: transistor TUP mounted in an emitter-follower configuration and a passive pull-down device, consisting of either the combination of transistor TB and resistor RB connected in series or a single resistor R' as mentioned above, to form the second current source. In both cases, the pull-down device acts as a passive load. On the other hand, transistor TUP is loaded with important line capacitances (including wiring and fan-out capacitances) represented by capacitor C1 at circuit output terminal 14. Loading capacitance C1 is connected to a reference potential, which is in the present instance, the potential of the ground GND. The usual values for capacitance C1 which are used for simulating circuit 10 are selected in the range extending from 0.1 to 4 pF.

At last, adjusting transistor sizes and resistor values is important to fix operating voltage levels and swings. In particular, the values of resistors R0, R1, RA (R) and RB (R') are determining parameters in that respect.

CSEF logic circuit technology is widely used in high speed applications, because it provides very fast switching times. It has the great advantage of being nearly independent of the base-emitter voltage (VBE) variation of the NPN transistors, since the critical level of the transfer characteristic is equal to the externally applied reference voltage. These variations are mainly due to temperature sensitivity and process tolerances. In circuit 10 of FIG. 1, this results from the connection of reference transistor T0 to node M, so that a good compensation of the variations of the base-emitter voltage VBE of input transistors is obtained. This advantage is very important, because it makes the circuit able to operate with signal swings of small amplitude which is favorable to fast switching times while still maintaining an excellent noise immunity. The current spikes due to these swings are also reduced and the power supply distribution system simplified.

Unfortunately, the conventional CSEF logic circuit 10 of FIG. 1 also has some important drawbacks. Firstly, it dissipates not negligible power because the emitter-follower output buffer 12 essentially consists of an active pull-up device, say transistor TUP, loaded by a passive pull-down device, typically resistor R' as explained above. Resistor R' must have a small value, so that in AC conditions, the loading capacitance C1 can discharge fast during downgoing transitions of the circuit output signal. For similar reasons, transistor TUP is a large device to allow loading capacitance C1 to charge rapidly during up-going transitions. In the quiescent state, as soon as transistor TUP is ON, the low value of resistance R' causes a large DC sink current between VC1 and VEE2. Most of the power that is consumed or dissipated by circuit 10 comes from this DC sink current necessary to discharge the loading capacitance C1 to VEE2. This DC sink current slows down the up-going transition because it is subtracted from the current supplied by the emitter-follower output buffer 12 and therefore decreases the current that charges up the loading capacitance C1. As a result, the CSEF logic circuit 10 has a relatively limited output driving capability. Moreover, the down-going transition is generally two to three times slower than the up-going transition, thereby causing an unbalanced response, i.e. an asymmetrical AC operation of circuit 10. Finally, a reference voltage generation and distribution scheme is necessary, whose complexity depends on the number of voltage generators that are implemented. These generators must be well regulated and necessitate a special distribution line in the semiconductor chip. In addition, they are a source of additional power consumption and silicon area waste, which in turn, lowers integration density.

The usage of the emitter-follower output buffer at the circuit output, eliminates some of the severe drawbacks of conventional CSEF logic circuits as shown in FIG. 1C of an article entitled "SPL (Super Push-pull Logic), "a bipolar novel low-power high-speed logic circuit" published in the digest of technical papers of the 1989 symposium on VLSI circuits. A typical SPL logic circuit is depicted in FIG. 2 of the present application reference 20. Circuit 20 is of the single power supply type (VEE, GND) and is characterized by the use of a preamplifier 21 combined with a push-pull output buffer stage 22. However, the potential of having a push-pull output stage in circuit 20 is not fully tapped, as will be explained later on. Node M of preamplifier 21 is fed by a current source I that simply consists of resistor R connected to supply voltage VEE. The output buffer stage is comprised of active pull up transistor TUP and active pull down transistor TDN. In DC, the bias of base node B of transistor TDN is determined by reference transistor T0 and resistor RE connected in series between VEE and GND. The base of reference transistor T0 is connected to a reference voltage generator supplying VRef1. In AC, node M is connected to the base of transistor TDN by a capacitor C'. Due to the usage of the push-pull output buffer, the DC sink current mentioned above, that was the cause of a large power dissipation and of an asymmetrical (unbalanced) AC operation, does not exist any longer. Unfortunately, there still remain some important drawbacks in circuit 20. First of all, because reference transistor T0 is not connected to node M in DC, transistors T1, T2 and T3 at node M are no longer compensated in VBE variations, which results in a severe degradation of the circuit noise immunity. The SPL circuit of FIG. 2 cannot be considered as belonging to the ECL circuit family, but rather to the non-threshold logic circuit family. Moreover, when node OUT2 is at a low level, the final state of transistor TDN is OFF (capacitor C' is charged); this results in a limited output driving capability of circuit 20 because capacitor C1 may not be fully discharged when transistor TDN turns OFF. Pull down transistor TDN conducts only a short time during the transient. To maintain transistor TDN in the ON state during the sufficient time would make necessary to have a large capacitor C'. This has the drawback of requiring a large amount of space. Due to the presence of capacitor C', output buffer stage 22 clearly does not fully operate as a true push-pull in DC and can be referred to as a "pseudo" push-pull. Finally, it is still required, as in the CSEF type of circuits, to provide reference voltage generation and distribution scheme, that has a negative impact on the chip density and power consumption. Since power dissipation is a limiting factor of paramount importance in high speed applications, fast logic circuits that have reduced power consumption are crucial to the development of advanced Ultra High Speed Integrated Circuits (UHSICs). It is also highly desirable to have circuits with symmetrical operations, say with well balanced up and down going transitions for smooth operation in the data paths. It is also highly desirable to have circuits with high output driving capability. In addition, there is a strong demand for ECL circuits compensated in VBE variations and adequate noise immunity. Finally, logic circuits with internally generated reference voltages would be much appreciated to avoid the inconveniences attached to the use of external reference voltage generators as mentioned above. Accordingly, there is a real need for a new family of dense and very high speed logic circuits of the ECL type that keep all the recognized advantages of both the SPL and CSEF circuit families but without their inherent drawbacks.

It is therefore a primary object of the present invention to provide a family of very high speed logic circuits, typically in bipolar ECL technology, that have reduced power dissipation even under high capacitive loading conditions.

It is another object of the present invention to provide a family of very high speed logic circuits, typically in bipolar ECL technology, with well balanced downgoing and up-going transitions in the circuit output signals.

It is another object of the present invention to provide a family of very high speed logic circuits, typically in bipolar ECL technology, that are compensated in VBE variations and exhibit excellent noise immunity.

It is another object of the present invention to provide a family of very high speed logic circuits, typically in bipolar ECL technology, that have high output driving capability.

It is still another object of the present invention to provide a family of very high speed logic circuits, typically in bipolar ECL technology, which operate with a reduced number of power supplies.

It is a still further object of the invention to provide a family of very high speed logic circuits, typically in bipolar ECL technology, that eliminates or at least significantly reduces the need for reference voltage generators.

These objects are achieved by the present invention. According to the basic principle of the present invention, there is disclosed a family of new circuits typically in bipolar ECL technology of the type including:

a) a preamplifier essentially consisting of a logic block driven by logic input signals coupled between first and second output nodes; the first output node is connected to a first current source tied to a first supply voltage; the second output node is connected to a load device, e.g. a resistor, tied to a second supply voltage; said preamplifier supplying two substantially simultaneous and complementary first and second output logic signals available at said first and second output nodes; and, b) a push-pull output buffer stage comprised of two active pull-up and pull-down transistors connected in series between second and third supply voltages with the circuit output node coupled therebetween; the bases of said pull-down and pull-up transistors being respectively driven by said first and second output signals;

characterized in that the said preamplifier further includes a biasing/coupling means connected to one of said supply voltage, that 1) in DC, appropriately biases both said first output node and the base node of the pull-down transistor depending on the levels of the inputs signals so that, when said first output node is at high level, the potential of base node at high level maintains the pull-down transistor in the ON state and when the first output node is at low level, the potential of base node is low or just to maintain the pull-down transistor in a slightly OFF state or in a slightly ON state (at the verge of conduction); and, 2) in AC, couples said first output and base nodes by a low impedance path for fast signal transmission.

Said biasing/coupling means simply consists of a voltage divider connected between said second supply voltage and said first output node. In a preferred embodiment, said voltage divider is formed by a resistor and a transistor connected in series with said base node coupled therebetween. Because the reference voltages usually necessary to bias said nodes are now internally generated from existing supply voltages, the conventional reference voltage distribution scheme based on external voltage generators is eliminated, so leading to a so called self-referenced preamplifier. In summary, according to the biasing/coupling means of the present invention, optimal DC and AC connections are provided to a self-referenced preamplifier which supplies complementary output signals to a true push-pull output buffer stage.

Figure 2:
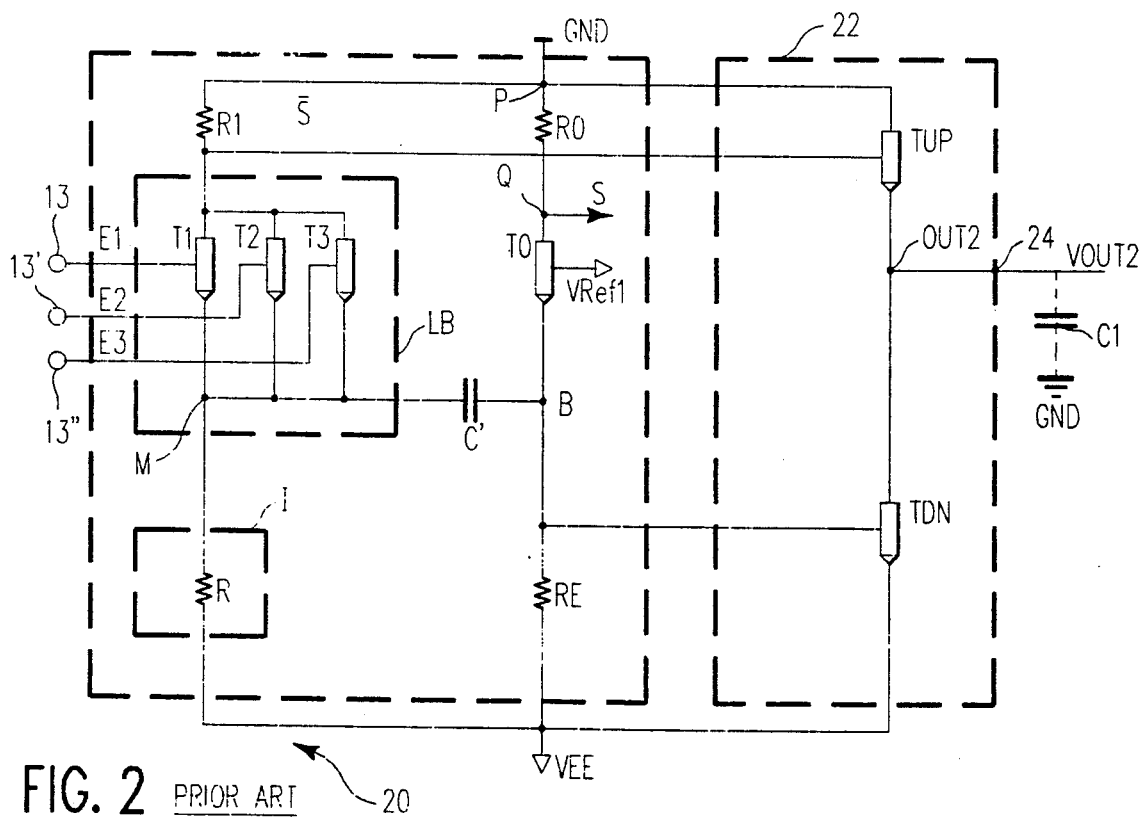
FIG. 2 shows the diagram of an improved SPL three-input NOR gate circuit of the prior art including a pseudo push-pull output buffer stage wherein a reference voltage is still supplied by an external voltage generator.
Figure 3:
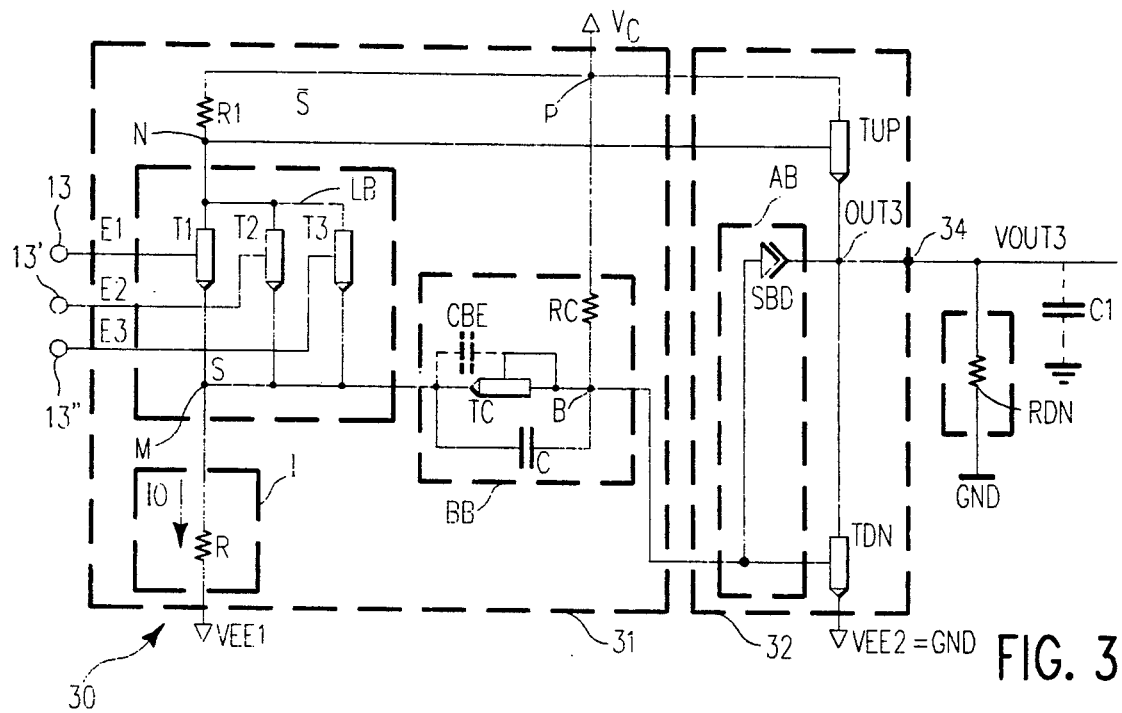
FIG. 3 shows the diagram of a three-input NOR circuit according to the teachings of the present invention comprising a self-referenced preamplifier with internally generated reference voltages and a true push-pull output buffer stage provided with an antisaturation circuit.

A base circuit according to the present invention is shown in FIG. 3, where a typical three-input NOR gate circuit referenced 30 is represented for illustrative purposes. Identical/corresponding elements with those of circuits of FIGS. 1 and 2 bear identical/corresponding references. Basically circuit 30 comprises a preamplifier 31 supplying complementary first and second output logic signals S and that drive a push-pull output buffer stage 32. The preamplifier 31 essentially consists of a logic block LB performing the desired logic function, e.g. a three-input NOR thanks to parallel connected NPN input transistors T1, T2 and T3. The logic NOR result or OUT OF PHASE output signal $\bar{S}$ which is the potential of the common collector of input transistors T1, T2 and T3, is available at output node N at full amplitude. The logic OR result or IN PHASE output signal S which is the potential of the common emitter of input transistors T1, T2 and T3, is available at output node M at reduced amplitude. Said common emitter and collector are respectively connected thru current source I and load resistor R1, to first and second supply voltages VEE1 and VC, in a very similar implementation to that of FIG. 2. The push-pull output buffer stage 32 is composed of two active devices: transistor TUP connected in an emitter-follower configuration and transistor TDN connected as an inverter. Both transistors are connected in series between second and third supply voltages VC, VEE2 with circuit output node OUT3 coupled therebetween. In the embodiment of FIG. 3, supply voltages VC=1.9V, VEE1=0.5V while supply voltage VEE2 is at the potential of ground. Transistor TUP provides the pull-up current required by the fast up-going transitions while transistor TDN supplies the pull-down current required by the fast down-going transitions. The base of transistor TUP is still directly driven by logic output signal $\bar{S}$, while, according to the present invention, the base of transistor TDN is driven by signal S through a biasing/coupling block BB included in preamplifier 31. In the preferred embodiment of FIG. 3 said biasing/coupling block BB comprises an active device TC, e.g. a diode-connected transistor and a resistor RC connected in series, with their common node connected to the base node B of the pull-down transistor TDN. The emitter of transistor TC is connected to node M, while the other end of the said resistor RC is connected to an existing supply voltage, e.g. said second supply voltage VC at node P. Broadly, block BB has two main functions. Firstly, in DC, it maintains the potential of nodes M and B at appropriate values depending the levels of the input signals, in others words, of the logic data applied to the circuit inputs. In particular, node M is biased to define adequate voltage threshold and noise immunity of preamplifier 31. Secondly, in AC, it ensures fast signal transmission from node M to node B. The base-emitter capacitance CBE of diode-connected transistor TC is useful to speed-up conduction of transistor TDN. Alternatively, device TC may be replaced by a transistor connected in reverse say, a transistor having its collector and its emitter respectively connected to nodes M and B, with the base-emitter junction shorted. Other devices include a Schottky Barrier Diode when a small voltage drop (VF) is preferred, and a standard PN diode. The base circuit just described may be significantly improved. In some instances, a coupling capacitor C may be connected between nodes M and B to increase the transmission of the AC component of signal S, to accelerate the turn ON and turn OFF times of transistor TDN if capacitance CBE reveals not to be sufficient on transients. Nominal values of capacitor C, as low as 20 to 50 fF have proved to be efficient in simulations. Note that, unlike capacitor C' in circuit 20 which is absolutely mandatory for proper operation, capacitor C in circuit 30 is optional, it only aims to boost the signal that is applied to the base of transistor TDN. Preferably, a resistor RDN can be connected between node OUT3 and the ground, to signal by maintaining transistor TUP in a slight conduction state. Lastly, usage of an antisaturation circuit scheme is recommended in high speed applications. As shown in FIG. 3, an antisaturation block AB may simply consist of a Schottky Barrier Diode, referenced SBD, connected between the base and collector of transistor TDN as known for those skilled in the art. Diode SBD acts as a clamping device to define the low level of circuit output node OUT3 to prevent transistor TDN from going into saturation.

Let us consider now, in detail, both the structure and operation of circuit 30 of FIG. 3. Devices R, TC, and RC, implement a DC voltage divider between first and second supply voltages, say VEE1 and VC. This voltage divider is intended to provide a DC bias current at nodes M and B to establish the appropriate DC levels. In DC, when at least one input signal, (e.g. E1) is high, the corresponding input transistor (e.g. T1) is ON, the current I0 passes thru this transistor but not in the other branch, say in the voltage divider. As a result, node M is high and device TC is OFF, separating nodes M and B. Node B is raised high e.g. about 900 mV strongly maintaining transistor TDN in the ON state. Capacitor C1 may then fully discharge thru transistor TDN to GND and the circuit output signal VOUT3 is at the low level. When all the input signals are low, all input transistors are OFF and the current I0 passes in the voltage divider. Voltage at node B is shifted down from supply voltage VC by the important voltage drop in resistor RC. The potential at node B is lower, e.g. 700 mV, and maintains transistor TDN in a slightly OFF state. Determination of values depends on values of VC, VEE1 and VEE2. The value of resistor RC is selected to adjust this voltage drop to the optimal level required to drive transistor TDN and therefore the potential of node M by controlling current I0 when input signals are at low level. Said voltage divider is also tuned to place input transistors T1, T2 and T3 of the logic block LB in the OFF state when input signals are low and in the ON state when input signals are high. The low voltage level at node M is always positive with respect to VEE1, since it is defined either by said voltage divider when input signals are low or raised to a higher value when at least one input signal is high. Circuit 30 is therefore quite different from circuit 20, it is a true push-pull because transistor TDN is biased in DC when circuit output node OUT3 is at the low level and, because it allows full discharge of capacitor C1, it has high output driving capability.

AC operation of circuit 30 is as follows. An up-going transition of input signal E1 applied on the base of input transistor T1, generates a small voltage transition on node M which is transmitted to the base of transistor TDN; the base-emitter capacitance CBE of diode-connected transistor TC provides the desirable boost. This capacitance CBE sinks a high transient current thru transistor T1, which in turn, speeds up the down-going transition on node N. As a result, transistor TUP is turned OFF, while transistor TDN discharges capacitor C1 at output node OUT3. On a down-going transition of the input signal E1, as soon as diode-connected transistor TC is ON, the down-going transition is transmitted from node M to the base of transistor TDN, which is completely turned OFF (no cross over current is observed). During the time transistor TDN is OFF, potential at node M decreases leading to a very fast potential change on node N, instantly transmitted to the circuit output node OUT3 thru transistor TUP.

In summary, block BB comprised of devices R, RC and TC serves different purposes:

In DC, when all the input signals are at low level, all input transistors are OFF, a current flows in the voltage divider and diode-connected transistor TC is ON. The voltage divider biases transistor TDN to be slightly OFF and the voltage level of node M by one VBE is shifted down with respect to the voltage of node B to maintain potential at node M at an adequate positive level with respect to VEE1. Note that existence of the base-emitter junction of diode-connected transistor TC also ensures compensation of the VBE variations of transistor TDN in addition to input transistors (as seen in ECL). On the other hand, when at least one input signal is at high level, the corresponding input transistor is ON, diode connected transistor TC is OFF. Devices RC and SBD maintain transistor TDN in the ON state and separate node B from node M. Therefore, potential base node B of transistor TDN is determined by the logic data applied to the circuit inputs.

In AC, it drives the base of transistor TDN with output signal S through a low impedance path. In addition, the operating speed of circuit 30 takes advantage of the charge stored in the base-emitter capacitance CBE at the base-emitter junction of diode-connected transistor TC to boost speed.

As a final result, block BB provides the preamplifier 31 with a defined threshold of switching, that can be accurately tuned to the desired value to ensure appropriate noise immunity and signal amplitude, by adjusting the ratio RC/R. Moreover, it also supplies internally generated reference voltages, from the existing power supplies, so that external reference voltage generators are thus no longer necessary.

Figure 4:
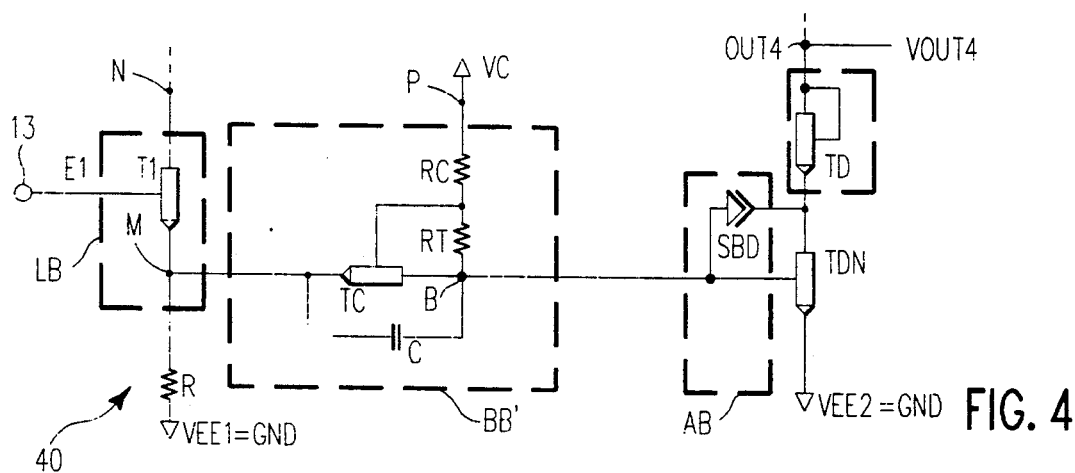
FIGS. 4, 5 and 6 show the diagrams of various embodiments of the circuit of FIG. 3 to accommodate to different power supply environments and/or antisaturation circuit implementations.
Figure 5:
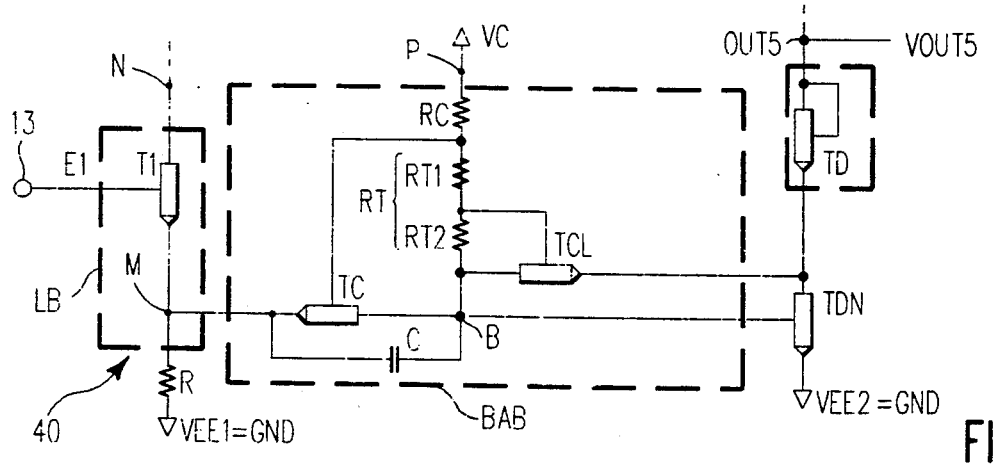

FIGS. 4 and 5 show partial views of two preferred embodiments of the present invention featuring a single power supply that have superior advantages in that respect when compared to other multi-power supply embodiments. In the embodiments of FIGS. 4 and 5, the first and third supply voltages VEE1 and VEE2 are at the potential of the ground GND. So, circuits 40 and 50 operate only with a single power supply (VC, GND). For sake of simplicity, only one input transistor, T1, has been represented.

In the circuit of FIG. 4 with respect to circuit 30 of FIG. 3, a few changes have been made to the biasing-/coupling block BB. Active device TC is still a standard transistor as in FIG. 3, but its base is now connected to a resistive bridge comprised of resistors RC and RT. The role of RT is to allow the use of a single power supply when VC is greater than 2V. A diode-connected transistor TD can be preferably connected between node OUT4 and the collector of transistor TDN. Device TD reduces the swing of circuit output signal VOUT4 without increasing the complexity of block AB.

Operation of circuit 40 is as follows. In DC, input transistor T1 is turned ON when a high level input signal is applied on its base, while transistor TC is OFF. Transistor TDN receives a base current thru RC and RT and the excess base current derived thru SBD is applied to the collector of transistor TDN to prevent the latter from saturation. As transistor T1 is ON, node N is down and transistor TUP (not represented) is OFF. The circuit output signal VOUT4 is at the low level. When the input signal is at a low level, input transistor T1 is OFF, transistor TC is ON, and transistor TDN is slightly OFF. Node N is up and maintains, thru transistor TUP that is conducting, the circuit output node OUT4 at the high level. A bias current flows through the voltage divider comprised of devices R, RC, RT and TC and defines a relatively high potential (about 400 mV) at node M which is used as the threshold voltage, to prevent input transistor T1 from conducting. Adjustment of this threshold voltage allows turn-on and the turn-off delay equalization and noise immunity tuning of the circuit 40. With this threshold voltage the preamplifier behaves like a differential stage of the prior art with a reference voltage at V(R)+VBE(TC), but with a significant difference: this equivalent reference voltage is internally generated. For this reason, transistor TC may be referred to as a pseudo reference transistor. The VBE of transistor TDN in the slightly OFF state can be determined from the following equations:

$$IC(TC) = \frac{VC - VBE(TC)}{R + RC}$$

$IE(TC) \approx IC(TC$ assuming that $IB(TC)$ is negligible.

$$VBE(TDN) = R.IE(TC) + VBE(TC) - RT.IC(TC)$$
finally
$$VBE(TDN) = \frac{(VC - VBE(TC))(R - RT)}{R + RT} + VBE(TC) \quad (1)$$

Let us calculate now the voltage swing VS. When the input signal is at the high level in DC, input transistor T1 is ON, transistor TC is OFF, and transistor TDN receives a base current thru resistors RC and RT. The excess of the base current is derived in the clamp diode SBD and then in the collector of transistor TDN to prevent it from saturation. As input transistor T1 is ON, node N is down and transistor TUP (not represented in FIG. 4) is OFF. The low level of the circuit output signal VOUT4 is defined by the clamping voltage of transistor TDN plus one VBE(TD), say: VBE(TD)−VF+VBE(TDN).

On the other hand, the high level of the circuit output signal VOUT4 is given by VC−VBE(TUP). Therefore the voltage swing VS is given by:

$$VC-(VBE(TUP)+VBE(TDN))+VF-VBE(TD) \quad (2)$$

From relations (1) and (2) important conclusions may be derived.

From relation (1), it can be seen that circuit 40 can have exact compensation if R=RT; but if required, the circuit can even over or under compensate. If R=RT, then VBE(TDN)=VBE(TC), and there is therefore a perfect compensation applied to transistor TDN, because VBE(TDN) is no longer dependent on VC. This keeps transistor TDN slightly OFF in a large range of temperatures, process and power supply variations. As a result, power dissipation tolerance is improved.

From relation (2), it can be seen that $$\frac{d(VS)}{dT} = \frac{-2dVBE}{dT}$$

since $$\frac{dVF}{dT} \approx \frac{dTVBE(TD)}{dt}$$

assuming that VF and VBE have the same exponential curve versus temperature T). and assuming that supply voltage VC is constant.

It is known that when temperature T increases, VBE decreases, thus the voltage swing VS increases. This results in a self-regulation of circuit 40 in terms of speed since small amplitude swings correspond to low speed conditions, and conversely, large amplitude swings correspond to high speed conditions. Because of this variable swing, rather constant delay and power dissipation, are obtained.

Although, the circuits of FIGS. 3 and 4 may appear to have some similitudes with a set of circuits described in the IBM Technical Disclosure Bulletin, Vol 24, No. 11A, April 1982, in two articles: "Low voltage current controlled gate" by D. C. Dunker et al, pp 5609–5612 and "Active pull-down circuit by current controlled gate" by A. H. Dansky et al, pp 5613–5618, the problems to be solved and operations of subject circuits are quite different. The circuits disclosed are subsequently referred to as the CCG circuits (CCG stands for Current Controlled Gate).

In AC, on the up-going transitions of the input signals, the CCG circuits and circuits 30 and 40 of the present application operate in a similar fashion but the circuits of FIGS. 3 and 4 have response faster. All circuits behave similarly on the downgoing transitions of the input signals but without the speed up effect caused by capacitor C that has been noticed in circuits 30 and 40 of the present application because in the CCG circuits, transistor T3 is OFF.

In DC, with input signals at a low level, we have a quite different situation in the circuits under comparison. In the CCG circuits, the potential at the common emitter node of transistors T1 and T2 is quite negligible, about 40 mV, that cannot be compared with the 400 mV existing at node M of circuits 30 and 40 of the present application, as mentioned above. The circuits of the present invention are superior in terms of noise immunity and speed. In the CCG circuits, as the VBE(T5) is defined by V(R3)+VBC(T3), transistor T5 is in a poorly controlled OFF state, while in circuit 40, thanks to resistor RT, as demonstrated by equation (1). The same optimum conditions are maintained whatever the temperature and or power supply variations. There is no compensation obtained with the CCG circuits which lead to larger swings, and therefore to slower circuits.

Note that the CCG circuits are of the single power supply type, and therefore significantly distinguishes them from circuit 30 of FIG. 3 which needs two power supplies to ensure the desired high voltage threshold mentioned above.

The circuit of FIG. 5 of the present application is directly derived from the circuit of FIG. 4 but it features a different anti-saturation construction so that circuit 50 is more appropriate for supply voltages VC larger than 2.2 volts and when the technology does not offer SBDs in the menu. The voltage divider now comprises three resistors RC, RT1 and RT2 connected in series instead of two. In fact, resistors RT1 and RT2 result from the splitting of resistor RT in two parts. The base of pseudo-reference transistor TC is connected to the common node of resistors RC and RT1. Clamping diode SBD is replaced by a clamp transistor referenced TCL. The base of transistor TCL is connected to the common node of resistors RT1 and RT2 (or a tap point of resistor RC) and its collector is connected to node B. The base of transistor TCL may also be understood as being connected to a tap point of resistor RT. The collector-base voltage of transistor TCL is adjusted by resistor RT2. Devices TCL and RT2 cooperate to prevent transistor TDN from going into saturation when circuit output node OUT5 is at a low level. Resistors RT1 and RT2 allow the down level of node M to be positive with respect to GND. In a similar operation to circuit 40 of FIG. 4, noise immunity is preserved by the voltage divider comprised of devices RC-RT1-RT2-TC-R, that allows a fine tuning of the circuit output signal amplitude (by adjusting the low level of the circuit output signal VOUT5 and the switching threshold).

As a result of the implementation of FIG. 5, the biasing/coupling block and the antisaturation block are merged in a single biasing/coupling/antisaturation block referenced BAB.

Another similar variant (not represented) of circuit 50 can be implemented. With respect to circuit 50, resistors RT1 and RT2 are exchanged. The collector of transistor TCL and the base of transistor TC are connected to the common node of resistors RT1 and RT2 and the base of transistor TC is connected to the common node of resistors RC and RT2.

Not only circuits of FIGS. 4 and 5, but many other versions can be derived from the base circuit of FIG. 3 to accommodate different power supply and technology environments, or to change the performances and logic capabilities. They are discussed hereafter on a few examples in conjunction with FIGS. 6 to 9.

Figure 6:
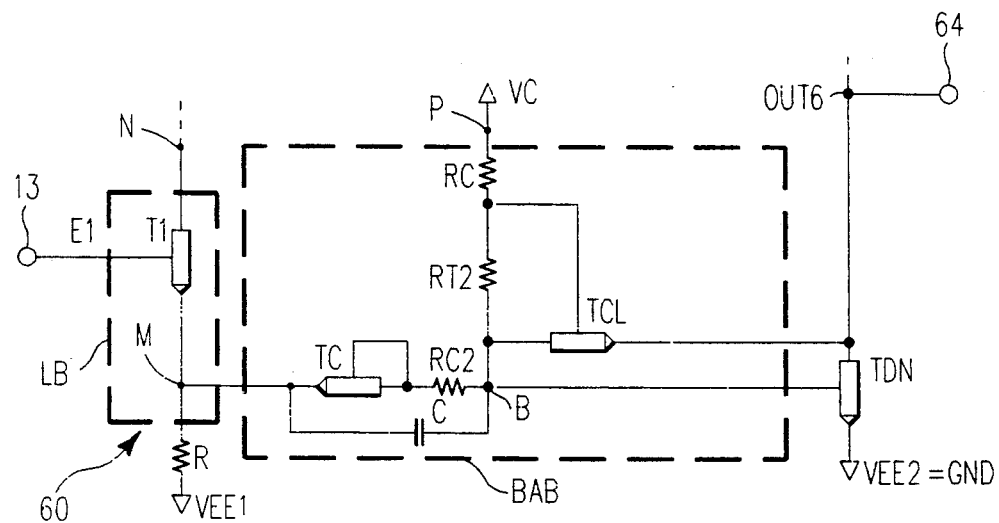

The circuits of FIGS. 4 and 5 are appropriate for applications where only one supply voltage VC larger than 2.2 volts is available. In this case, the voltage drop between nodes M and B can be reduced to a value lower than one VBE by introducing resistor RT or RT1 and RT2 but for application where two supply voltages, e.g. VC=1.7V and VEE1=−0.5V are available, a different implementation is necessary. When VC is lower than 1.7 volt, the voltage drop as shown in FIG. 6, can be increased to a value larger than one VBE by introducing resistor RCT between the collector of transistor TC and node B as shown in FIG. 6. This allows node M to reach a voltage level lower than GND when the input signal is at a low level. In circuit 60 of FIG. 6, the collector of transistor TCL is connected to node B, and its base is connected to the common node of resistors RC and RT2. Device TC is a diode-connected transistor as in FIG. 3. The biasing/coupling/antisaturation block is referenced BAB'. The circuit of FIG. 6 is therefore of the dual power supply type (VC, VEE1, GND), it has the inconveniences of necessitating two power supplies, but it is faster than circuits of FIGS. 4 and 5.

Figure 7:
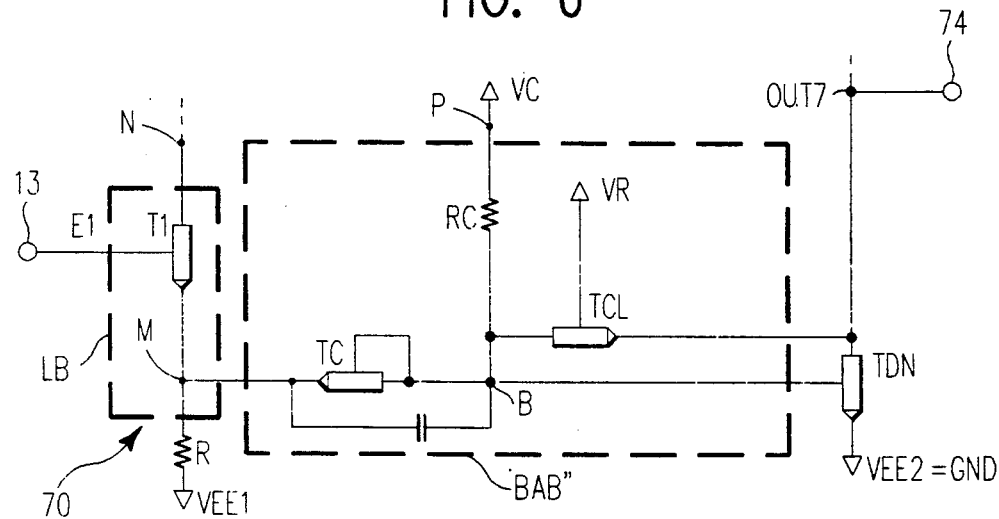
FIG. 7 shows the diagram of another embodiment of the circuit of FIG. 3 wherein a reference voltage

The embodiment shown in FIG. 7 is applicable on both single or dual power supply solutions as far as a reference voltage generator is available on the chip. A separate reference voltage VR is connected to the base of clamp transistor TCL, connected in the common base mode with its collector connected to base node B. Transistor TCL is used to clamp the circuit output signal VOUT7 at the low level to prevent the pull-down transistor TDN from deep saturation. With this design, circuit 70 can be tuned in a more flexible way, while still keeping advantages of the base circuit of FIG. 3 in terms of VBE variation compensation and noise immunity, but this is at the cost of the implementation of a reference voltage generator with the inconveniences cited above. The implementation of the biasing/coupling/antisaturation block of FIG. 7 is referenced BAB''. The circuit operating point is adjusted exactly the same way as mentioned previously in connection with circuit 30 of FIG. 3.

Figure 8:
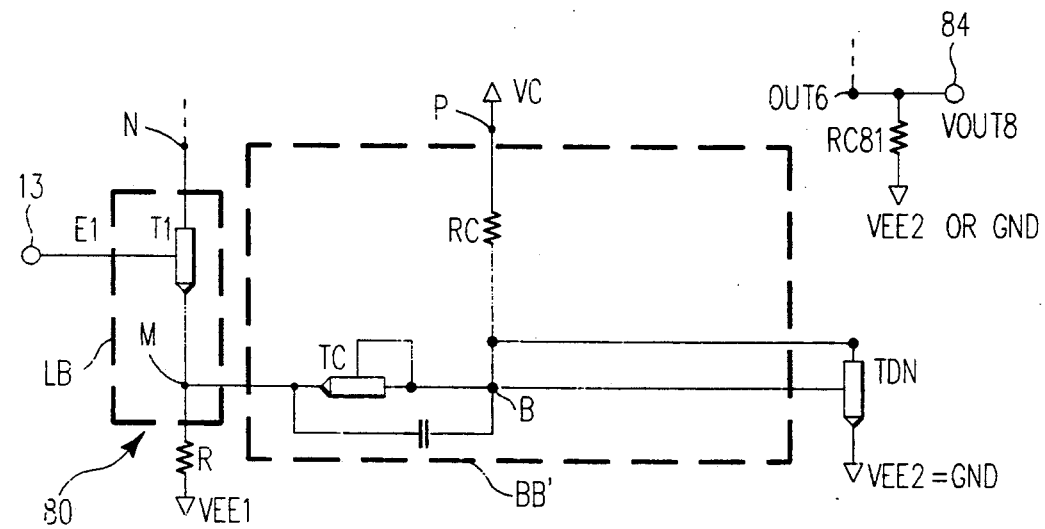
FIG. 8 shows a diagram of still another embodiment of the circuit of FIG. 3 with the wired DOT capability.

The need often exists for an optional wired OR capability (called OR DOT) on the circuit output node of the output buffer stage, to maintain the corresponding logic capability that is offered in conventional ECL implementations, while still keeping or even improving the excellent noise immunity and speed of that technology. Such an embodiment is shown in FIG. 8 that keeps the small sensitivity of ECL circuits in terms of speed and power vs VBE variations. It is obtained by connecting a pull down resistor R81 (that corresponds to resistor R' of FIG .1) to the circuit output node OUT8. Resistor R81 plays not only the same role as resistor RDN mentioned above, but also acts as a current sink, so it must have a lower value. The other end of resistor R81 is tied to GND or VEE2 or to any current source. There is no longer a push-pull effect and transistor TDN operates like a reference diode. The biasing/coupling block referenced BB' is quite similar to block BB of FIG. 3. In that case, the dissipation is larger and the high level of the circuit output signal VOUT8 is slightly lower when compared to circuits comprising a push-pull output buffer stage, because of the DC current that flows in transistor TUP. This may eventually necessitate a readjustment of the signal amplitude or of the switching threshold.

Figure 9:
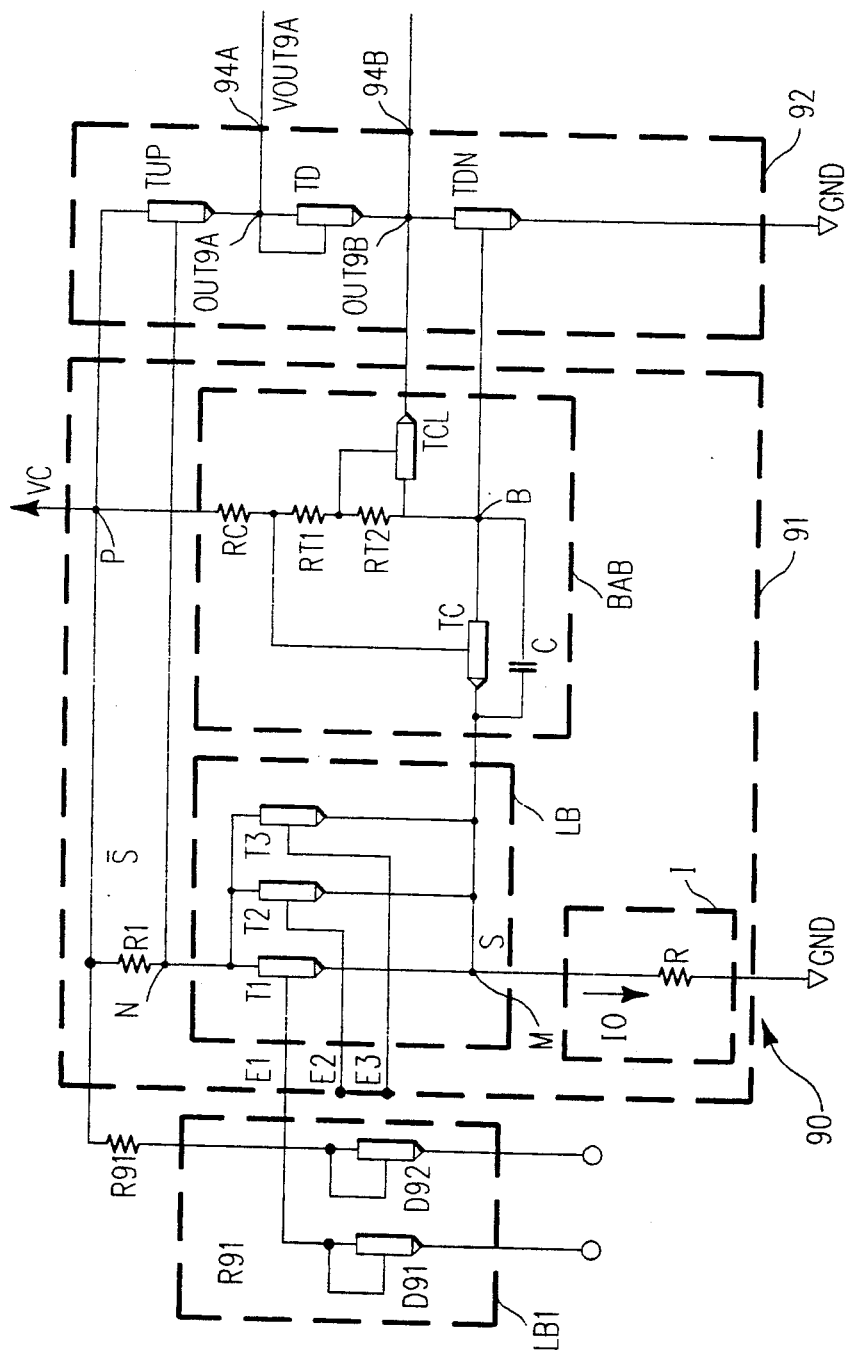
FIG. 9 shows the diagram of still another embodiment of the circuit of FIG. 3 with the AND-OR-INVERT (AOI) capability.

All the circuits shown in FIGS. 3 to 8 perform a NOR (or an INVERT) function in block LB. Unfortunately, the NAND logic function cannot be implemented in block LB, and therefore the AOI function which is often desired by system designers is not achieved. FIG. 9 illustrates a circuit extension that implements this AOI function in the circuits of the present invention. The embodiment shown in FIG. 9 takes advantage of the fact that in some implementations a diode-connected transistor TD is connected in series with the pull-up and pull-down transistors TUP and TDN as previously explained in connection with circuits shown in FIGS. 4 and 5 of the single power supply type. In FIG. 9, the circuit output voltage level at node OUT9B is shifted one VBE down from the level at OUT9A. OUT9A being the generic node used for the NOR operation of all the circuits described in FIGS. 3 to 8. This downward voltage shift allows the introduction of an additional AND logic block LB1 connected to the base of at least one input transistor of block LB performing the NOR function. This AND block LB1 is simply made of rectifying elements loaded by a pull up current device. FIG. 9 shows, for instance, diodes D91 and D92 loaded by a resistor R91 connected to the said second supply voltage VC. The set of diodes performs an AND function which can be combined with the NOR function of the circuits to obtain the desired AOI function, at the cost of a small delay and power dissipation increase. The flexibility is maximum as both types of outputs OUT9A and OUT9B can be used independently. In other words, any circuit of FIGS. 3 to 7 implemented according to the teachings of circuit 90, can be mixed and interconnected wherever applicable (in particular with single power supply). They are fully compatible as far as device TD is present.

In circuit 90, the ANDed input signals, such as supplied by blocks LB1, offer more powerful logic function to the circuits of the present invention, in a very flexible manner and at a very low cost in delay, power and consumed area. Circuit 90 includes all the basic logic functions of the library, e.g. NOR, NAND, INVERT, . . . that are necessary to the circuit designer. Note that, block LB1 can be implemented in different ways using different devices such as SBDs, high speed PNPs, or diode-connected NPN transistors.

Figure 1:
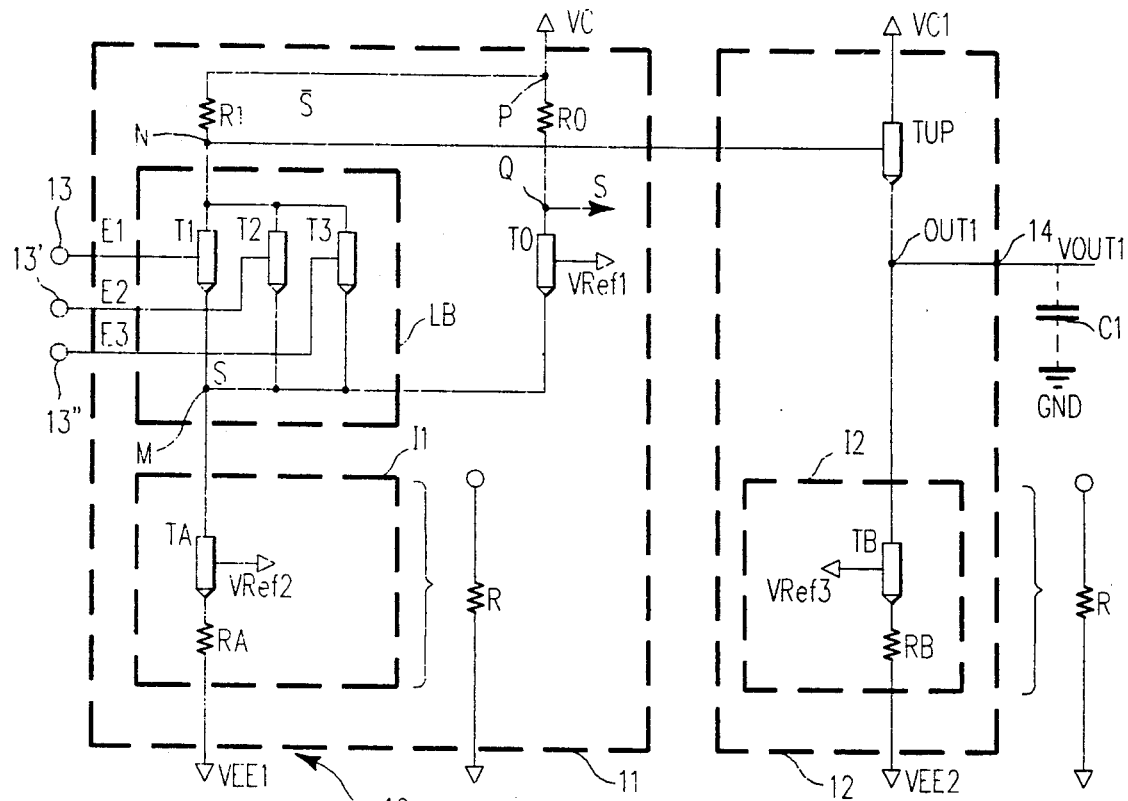
FIG. 1 shows the diagram of a standard CSEF three-input NOR gate circuit of the prior art including an emitter-follower output buffer stage wherein the reference voltages are supplied by external voltage generators.

The self-referenced current switch three-input NOR gate push-pull circuit of FIG. 3 has been compared with the conventional CSEF three-input NOR gate circuit of FIG. 1 both placed in the same conditions for comparison, including a similar dissipated power of about 1.5 mW per gate under same nominal loading conditions (C1=0.24 pF).

The results of simulations are listed in the following table:

| Ref. circuit | Av. delay (psec) | Power dissip (mw) | Rd/Fd | Delay × Power |
|---|---|---|---|---|
| 10(FIG. 1) | 0.131 | 1.5 | 76/186 | 0.190 |
| 30(FIG. 3) | 0.050 | 1.5 | 50/48 | 0.075 |

Adding the speed up capacitor C of 50 fF in the circuit of FIG. 3 gives an additional 12% improvement to the figures given in the table.

These figures not only show a large improvement in speed but also a much better symmetry of the rise delay (Rd) and the fall delay (Fd) of the circuit output signals VOUT3 vs VOUT1.

Figure 10:
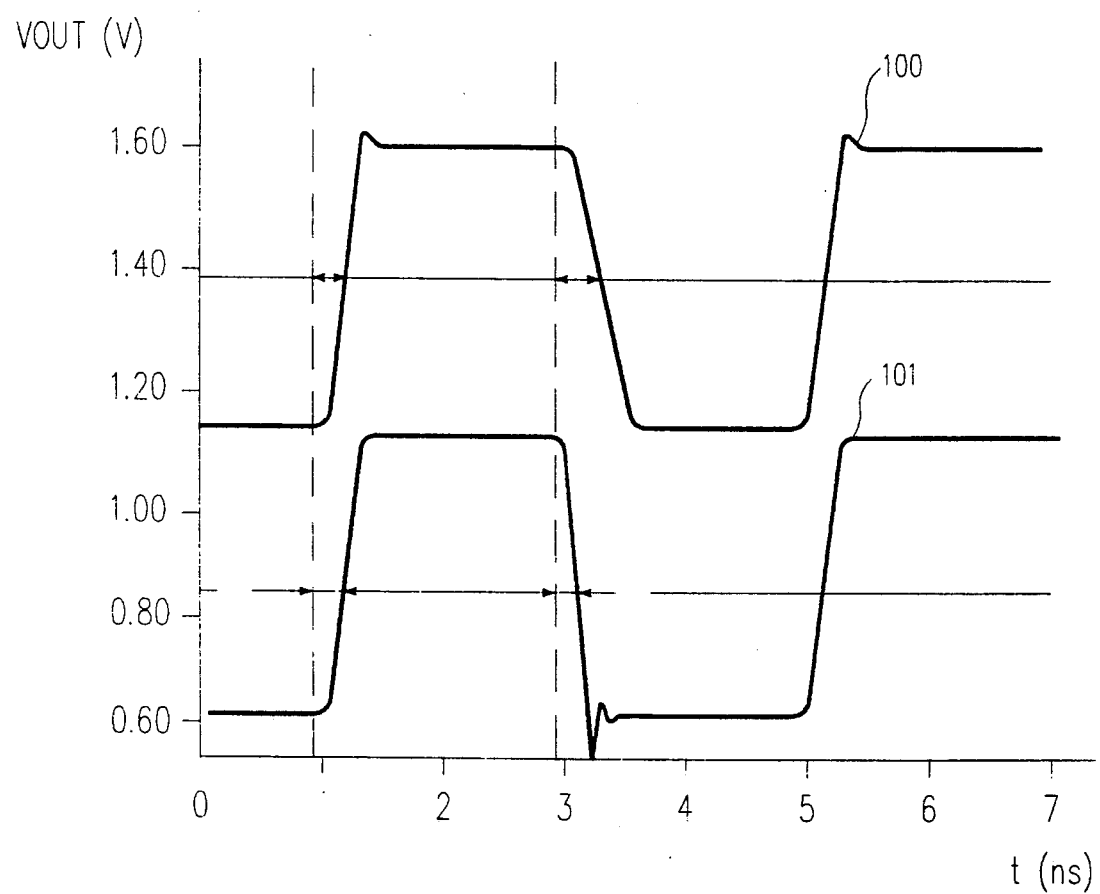
FIG. 10 shows a graph illustrating the typical waveforms of the circuit output signals obtained with the circuits of FIGS. 1 and 3 when operating with identical capacitive loading conditions.

This is apparent from FIG. 10, that shows typical waveforms of the circuit output signals respectively referenced 100 and 101 for the circuits of FIGS. 1 and 3 which clearly illustrate in particular the well balanced delays that are obtained in the circuit of FIG. 3.

These simulations demonstrate in particular that:

the true push-pull output buffer of the present invention can provide a 2 to 2.5 speed improvement factor over the conventional emitter-follower output buffer of the CSEF circuits at same power dissipation, because the pull-down transistor TDN is strongly driven, in all the embodiments of the present invention. This advantage should even be more pronounced with heterojunction transistors that have higher cutoff frequencies than homojunction transistors, because of the high speed that is required to operate the pull-down transistor TDN connected in an inverter configuration.

well balanced rise/fall delays are achievable because the two phases (IN PHASE and OUT OF PHASE) of the signals that intermediately drive the push pull, are treated in a similar way. In the circuit of FIG. 3, the top and bottom paths are of equal length: viz, inverter (transistor TDN) driving an emitter-follower (transistor TUP) on the top part of circuit 30 and emitter-follower (transistor TUP) driving an inverter (transistor TDN) on the bottom part of circuit 30.

The concept of the present family of circuits is particularly attractive from the noise immunity point of view when compared with standard and SPL modern circuits, since it preserves the principle of a relatively high threshold level for the switching, and from its capability to generate the reference voltages internally. Seen as a whole, the present family of circuits has the desired versatility and speed characteristics that are required for the advanced high end computers to come.

We claim:

1. An emitter coupled logic (ECL) circuit, comprising:

a preamplifier means comprised of a logic block having input transistors for performing a predetermined logic function and having substantially simultaneous and complementary first and second output logic signals, said input transistors being driven by logic input signals wherein said input transistors are coupled between first and second output nodes and wherein said first and second output logic signals are available at said first and second output nodes respectively;

a first current source and a first supply voltage wherein said first output node is coupled to said to set first power supply through said first current source;

a load device and a second supply voltage, wherein said second output node is coupled to said second power supply through said load device;

a third supply voltage;

push-pull output buffer stage means having a circuit output node, said push-pull output buffer stage means comprised of at least two active pull-up and pull-down transistors, said pull-up and pull-down transistors connected in series circuit relationship between said second and said third supply voltages wherein said circuit output node is coupled therebetween, and wherein the bases of said pull-down and said pull-up transistors are respectively driven by said first and said second output logic signals; and biasing means coupled to said first, said second and said third supply voltages for biasing said first output node and said base of said pull-down transistors as a function of the levels of said logic input signals, and coupling said first output node and said bases of said pull-up and said pull-down transistors with a low impedance path.

2. The ECL circuit of claim 1 wherein said pull-up and pull-down transistors are of the NPN type and wherein said second output node is connected to the base of said pull-up transistor.

3. The ECL circuit of claim 2 wherein said biasing means consists of a biasing/coupling block connected to said second supply voltage which applies a relatively high threshold voltage to said first output node in DC to improve the noise immunity of the circuit.

4. The ECL circuit of claim 3 wherein said biasing/coupling block consists of an active device connected in series with resistive means.

5. The ECL circuit of claim 4 wherein said active device is a diode and said resistive means is a single resistor, to form a voltage divider between said first output node and said second supply voltage; the cathode of said diode is connected to said first output node; the common node formed by the anode and one end of said resistor being connected to the base node of said pull-down transistor, and the other end of said resistor being connected to said second supply voltage.

6. The ECL circuit of claim 4 wherein said active device is a diode-connected transistor and said resistive means is a resistor to form a voltage divider between said first and said second supply voltage; the emitter of said diode-connected transistor is connected to said first output node; the common node formed by the shorted collector-base junction and one end of said resistor is connected to the base node of said pull-down transistor, and the other end of said resistor being connected to said second supply voltage.

7. The ECL circuit of claim 4 wherein said active device is a pseudo-reference transistor and said resistive means consists of two first and second resistors, connected in series; the base, the emitter, and the collector of said pseudo-reference transistor, are respectively connected to the common point of these resistors, to said first output node; and to the base node of said pull-down transistor.

8. The ECL circuit of claim 7 wherein said current source consists of a resistor, whose value is equal to the value of said second resistor.

9. The ECL circuit of claim 1 further including an antisaturation means connected between the base node and the collector of said pull-down transistor to prevent it from going into deep saturation.

10. The ECL circuit of claim 9 wherein said anti-saturation means consists of a Schottky Barrier Diode connected across the base-collector junction of the pull-down transistor.

11. The ECL circuit of claim 7 further including an antisaturation means consisting of a clamp transistor, whose emitter is connected to the collector of the said pull down transistor; the base is connected to a tap point of said second resistor split into two parts, and the collector is connected to said base node; so that said biasing/coupling block and antisaturation means are merged in a single block.

12. The ECL circuit of claim 7 wherein first and third supply voltages are at the potential of ground so that the ECL circuit is of the single power supply type.

13. The ECL circuit of claim 11 wherein an additional resistor is connected in series between the base node and the collector of the pseudo reference transistor so that said biasing/coupling and antisaturation means are merged in a single block.

14. The ECL circuit of claim 6 further including an antisaturation means consisting of a clamp transistor, whose emitter is connected to the collector of the said pull down transistor, the collector is connected to the base node of the pull down transistor and the base is connected to a reference voltage so that said biasing/coupling and antisaturation means are merged in a single block.

15. The ECL circuit of claim 12 wherein a level shifter device is connected between the circuit output node and the collector of the pull-down transistor.

16. The ECL circuit of claim 15 wherein a speed-up capacitor is connected between said first output node (M) and the base node of said pull-down transistor.

17. The ECL circuit of claim 16 wherein a resistor is connected to the said circuit output node.

18. The ECL circuit of claim 6 wherein the collector of the pull-down transistor is disconnected from the circuit output node and connected to the base node, to define emitter DOT capability.

19. The ECL circuit of claim 18 wherein a resistor is connected to the said circuit output node.

20. The ECL circuit of claim 18 wherein said logic block performs a NOR function.

21. The ECL circuit of claim 20 wherein a N-way AND gate circuit is connected to the base of at least one input transistor.

* * * * *